United States Patent
Zheng et al.

(10) Patent No.: US 7,671,403 B2
(45) Date of Patent: Mar. 2, 2010

(54) P-CHANNEL NAND IN ISOLATED N-WELL

(75) Inventors: Wei Zheng, Santa Clara, CA (US); Chi Chang, Saratoga, CA (US); Mark Randolph, San Jose, CA (US); Satoshi Torii, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 225 days.

(21) Appl. No.: 11/567,257

(22) Filed: Dec. 6, 2006

(65) Prior Publication Data
US 2008/0135918 A1    Jun. 12, 2008

(51) Int. Cl.
*H01L 29/792* (2006.01)
(52) U.S. Cl. .................... 257/324; 257/E29.309
(58) Field of Classification Search ......... 257/324–326, 257/E29.309, E21.679
See application file for complete search history.

(56) References Cited

U.S. PATENT DOCUMENTS 6,784,481 B2 * 8/2004 Shin et al. ................. 257/314
7,064,382 B2 * 6/2006 Kodama et al. ............ 257/316
7,449,747 B2 * 11/2008 Ishii et al. ................. 257/322

* cited by examiner

*Primary Examiner*—Mark Prenty
(74) *Attorney, Agent, or Firm*—Harrity & Harrity, LLP

(57) ABSTRACT

A device includes a substrate and multiple wells formed over the substrate and isolated from one another by dielectric trenches. The device further includes multiple memory elements formed over the wells, each of the memory elements extending approximately perpendicular to the wells and including a material doped with n-type impurities. The device also includes multiple source/drain regions, each source/drain region formed within one of multiple trenches and inside one of the plurality of wells between a pair of the memory elements, each of the source/drain regions implanted with p-type impurities. The device further includes a first substrate contact formed in a first one of the multiple trenches through a first one of the wells into the substrate and a second substrate contact formed in a second one of the multiple trenches through a second one of the wells into the substrate.

19 Claims, 21 Drawing Sheets

US 7,671,403 B2

P-CHANNEL NAND IN ISOLATED N-WELL

TECHNICAL FIELD

The present invention relates generally to semiconductor devices and, more particularly, to NAND type non-volatile memory devices.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are a type of EEPROM device in which memory cells can be programmed and erased electrically as a block or group.

Product development efforts in EEPROM device technology have focused on increasing the programming speed, lowering programming and reading voltages, increasing data retention time, reducing cell erasure times and reducing cell dimensions. One conventional structure used for fabricating an EEPROM device is an oxide-nitride-oxide (ONO) structure. One EEPROM device that utilizes the ONO structure is a Mirrorbit (MB) type device. In a MB type device, an ONO stack is formed on a silicon substrate. A silicon control gate is then formed over the ONO stack. Another EEPROM device that utilizes the ONO structure is a floating gate FLASH memory device, in which the ONO structure is formed over the floating gate, typically a polysilicon floating gate.

In MB devices, during programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon oxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

Using existing techniques, individual memory cells may be organized into arrays to produce NAND type devices. In such existing NAND type devices, self boosting of the channel potential is required to inhibit programming on an unselected bit-line during programming of a selected bit-line.

DISCLOSURE OF THE INVENTION

According to an aspect of the invention, a device may include multiple columns, each of the columns including an oxide-nitride-oxide (ONO) stack and a layer of material formed over the ONO stack and separated from one another by multiple first trenches. The device may further include multiple wells formed beneath, and transverse to, the multiple columns, each of the wells including a semiconducting material doped with n-type impurities and being separated from one another by second trenches of dielectric material.

According to a further aspect of the invention, a device may include a substrate and multiple wells formed over the substrate and isolated from one another by dielectric trenches. The device may further include multiple memory elements formed over the multiple wells, each of the memory elements extending approximately perpendicular to the multiple wells and including a material doped with n-type impurities. The device may also include multiple source/drain regions, each source/drain region formed within one of multiple first trenches and inside one of the plurality of wells between a pair of the multiple memory elements, each of the multiple source/drain regions implanted with p-type impurities. The device may further include a first substrate contact formed in a first one of the multiple trenches through a first one of the multiple wells into the substrate and a second substrate contact formed in a second one of the multiple trenches through a second one of the multiple wells into the substrate.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Consistent with aspects of the invention, memory cells may be organized into an array of memory cells that form P-channel NAND type devices. The P-channel NAND type devices may sit in respective isolated N wells. Use of N wells, consistent with aspects of the invention, eliminates the need for self-boosting of the channel potential required in existing NAND type devices for inhibiting programming on unselected bit-lines during programming of selected bit-lines.

Figure 1:
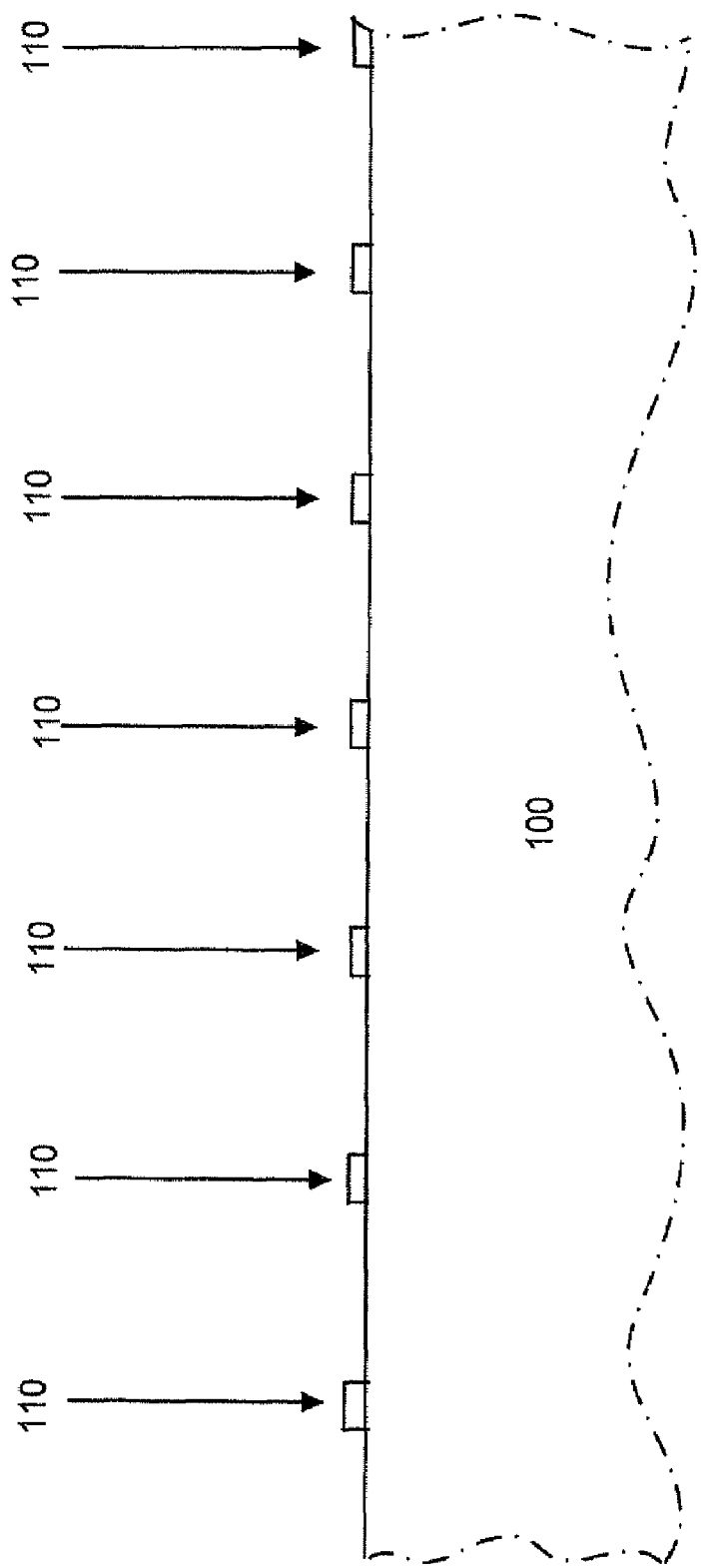
FIG. 1 illustrates the formation of a photo-resist layer of over a substrate consistent with an aspect of the invention.

FIG. 1 illustrates a cross-section of a semiconductor substrate 100 according to an exemplary embodiment. Substrate 100, consistent with one aspect, may include a crystal silicon wafer. In other implementations, substrate 100 may include a gallium arsenide layer, a silicon-on-insulator structure, a germanium layer, a silicon-germanium layer, or other conventional materials used to form a semiconductor substrate. A layer of photo-resist 110 may be formed on substrate 100 and may be patterned using existing photolithographic techniques. Layer 110 may include for example, a nitride. The pattern of layer 110 may correspond to the desired configuration of isolation trenches to be formed in substrate 100.

Figure 2:
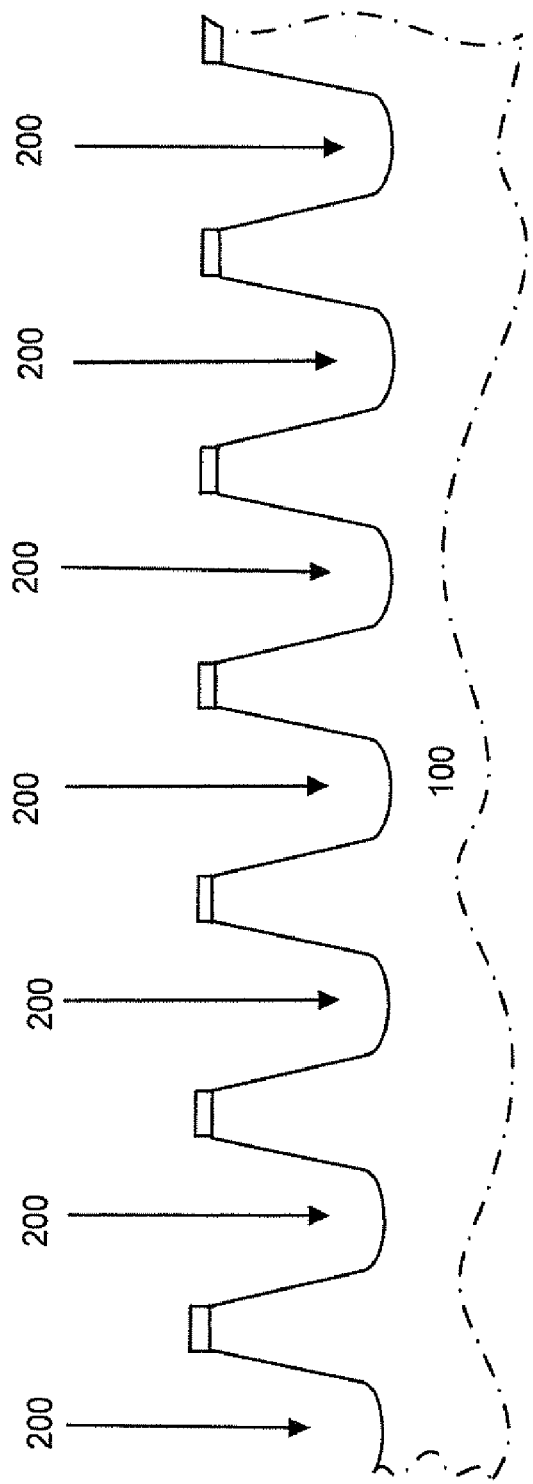
FIG. 2 illustrate the formation of isolation trenches within the substrate of FIG. 1 consistent with an aspect of the invention.

As further shown in FIG. 2, isolation trenches 200 may be etched in substrate 100 in a configuration corresponding to the pattern formed in layer 110. As shown, each isolation trench 200 may be formed to a depth h ranging from about 2,000 Å to about 10,000 Å below an upper surface of layer 110. Each isolation trench 200 may further be formed to have a width w ranging from about 300 Å to about 3,000 Å. A spacing between successive isolation trenches 200 may include a distance ranging from about 300 Å to about 3,000 Å

Figure 3:
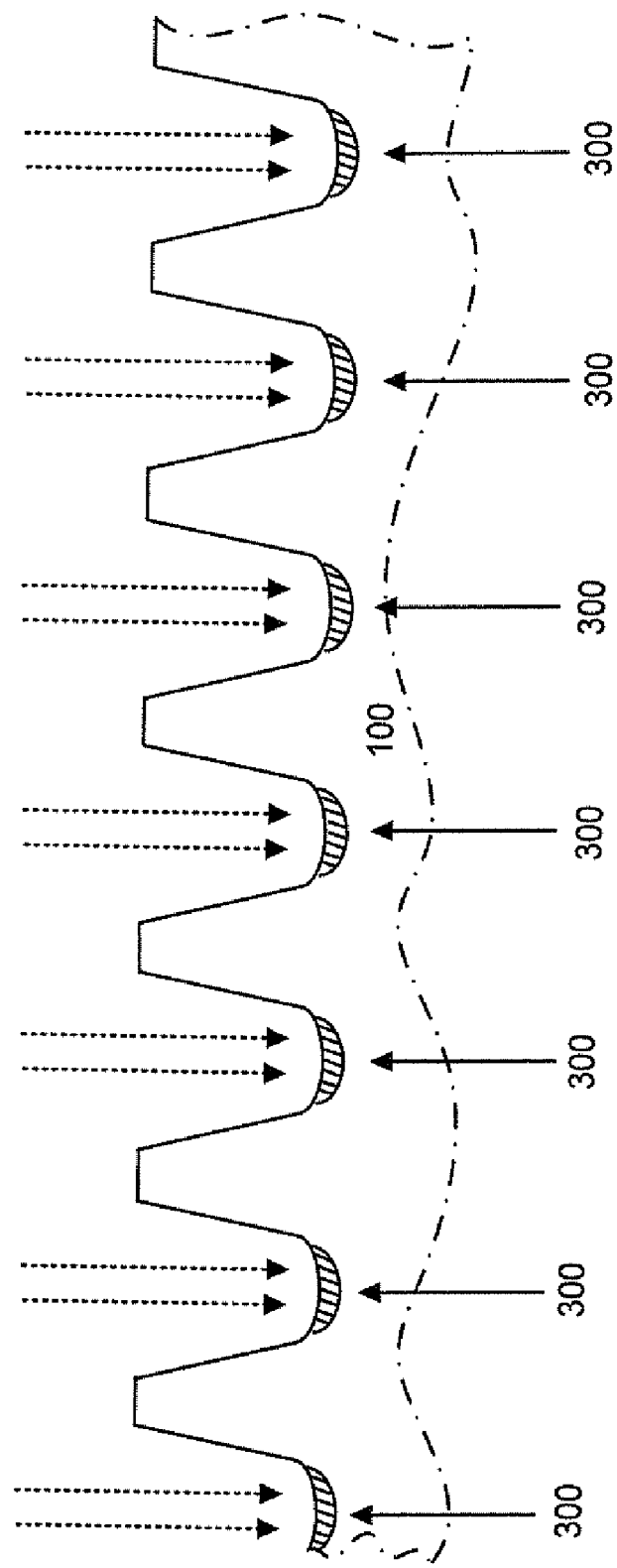
FIG. 3 illustrates the formation of a isolation regions within each isolation trench of FIG. 2 consistent with an aspect of the invention.

P-type impurities, such as, for example, boron, may then be implanted in substrate 100, as shown in FIG. 3, to form P-type isolation regions 300 at the bottom of each isolation trench 200. The impurities may be implanted at a dosage and implantation energy appropriate for the specific device being formed to ensure adequate isolation between neighboring trenches. Subsequent to formation of isolation trenches 200, photo-resist layer 110 may be removed.

Figure 4A:
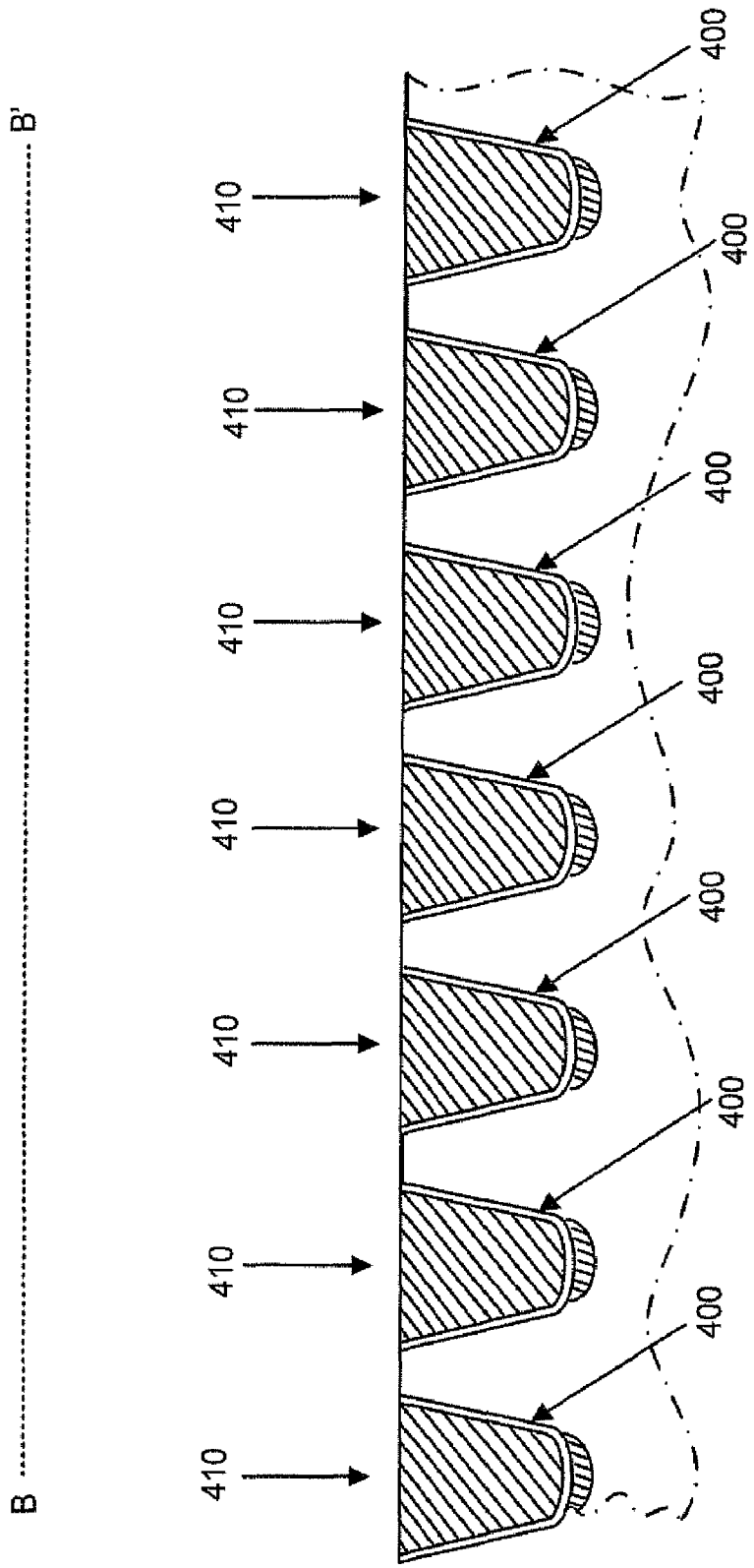
FIGS. 4A and 4B illustrate the formation of a liner and dielectric material within each isolation trench of FIG. 3 consistent with an aspect of the invention.

After implantation of isolation regions 300, a trench liner 400 may be formed in each isolation trench 200, as shown in FIG. 4A. FIG. 4A depicts a cross-section taken along line B-B' in FIG. 4B. Trench liner 400 may be formed to a thickness of approximately 100 Å and may include an oxide material. As further shown in FIGS. 4A and 4B, dielectric material 410 may then be formed in each trench 200 over a respective trench liner 400. Dielectric material 410 may include any type of dielectric material, such as, for example, an oxide material.

Figure 4B:
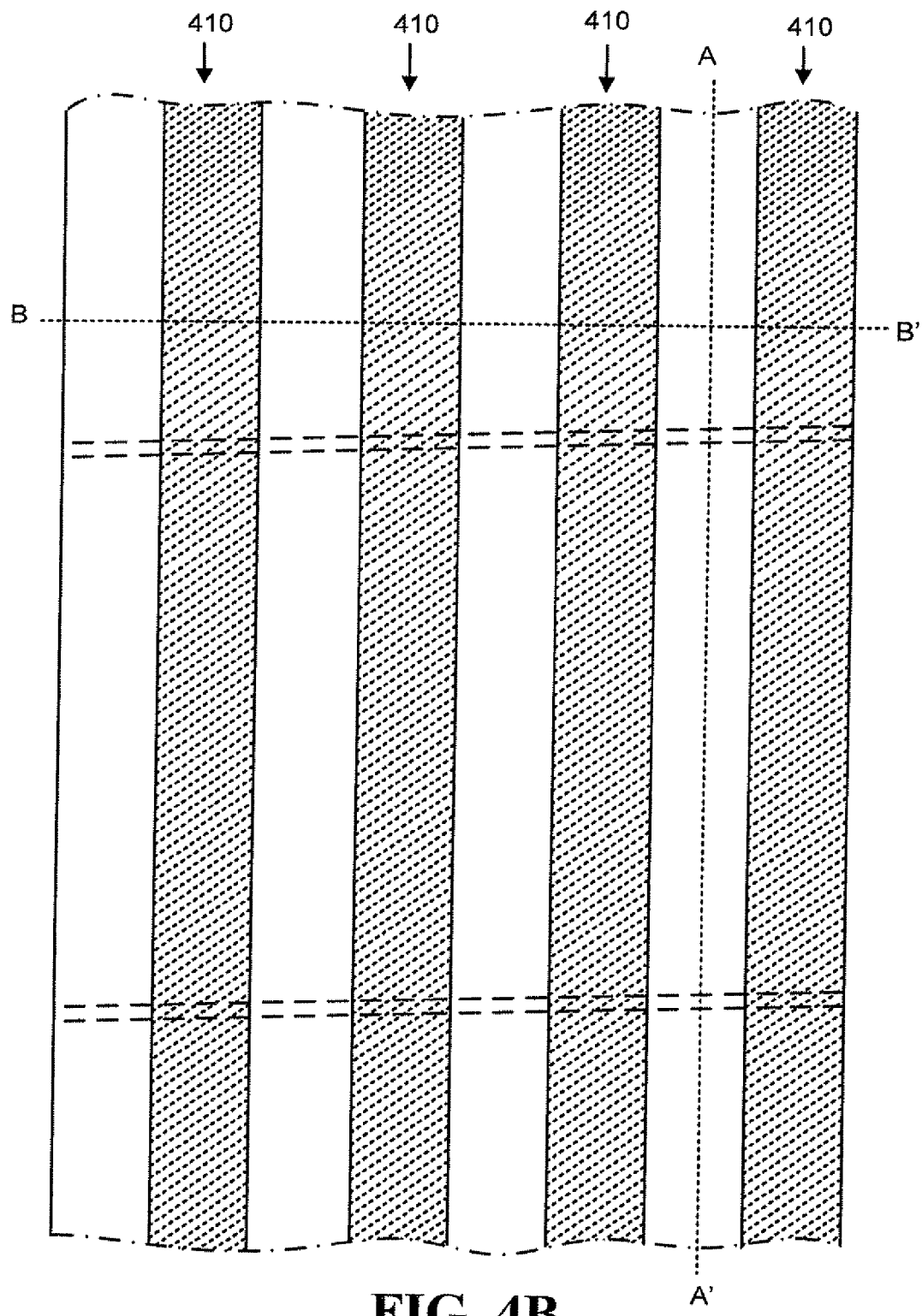
Figure 5A:
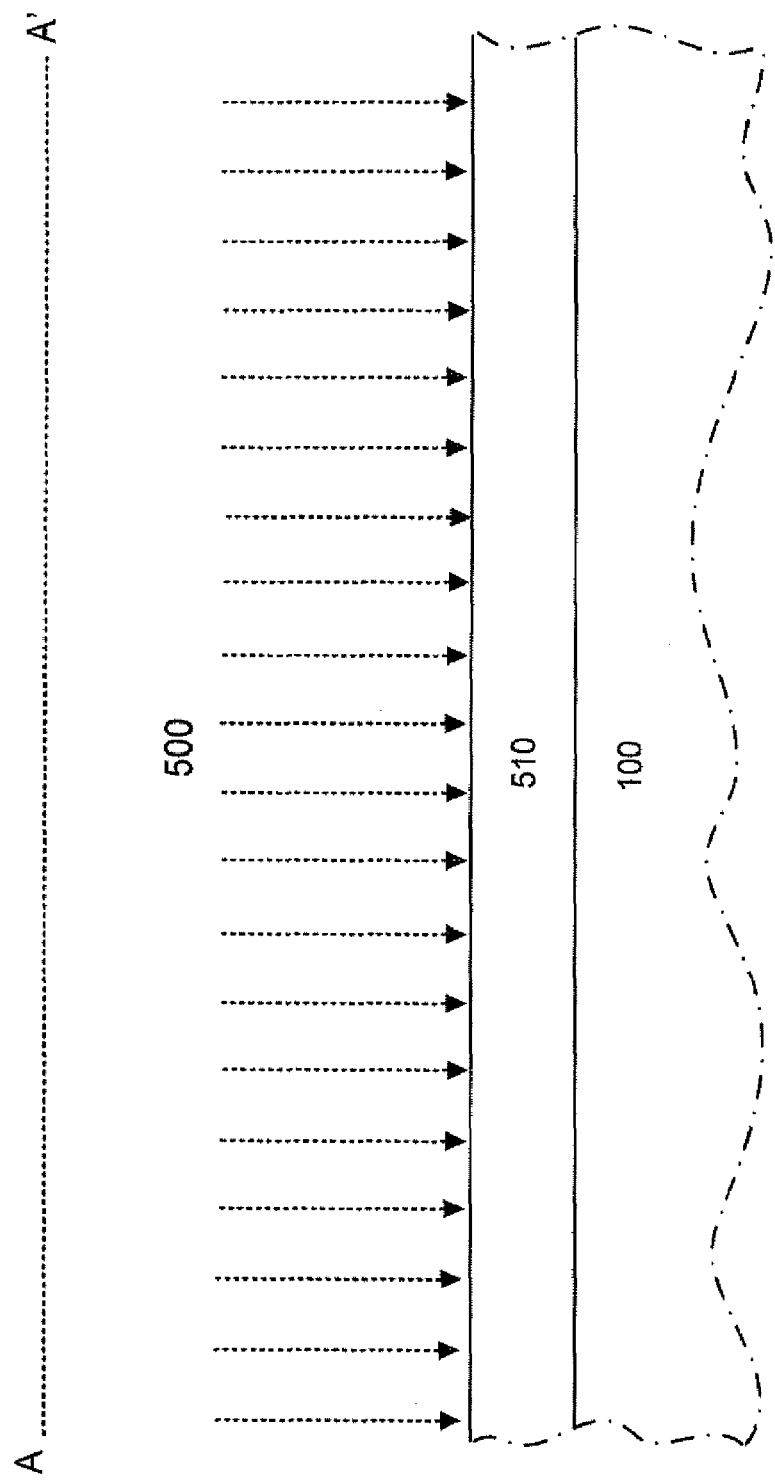
FIGS. 5A and 5B illustrate the implantation of N-type impurities to form Nwells between the isolation trenches of FIGS. 4A and 4B consistent with an aspect of the invention.
Figure 5B:
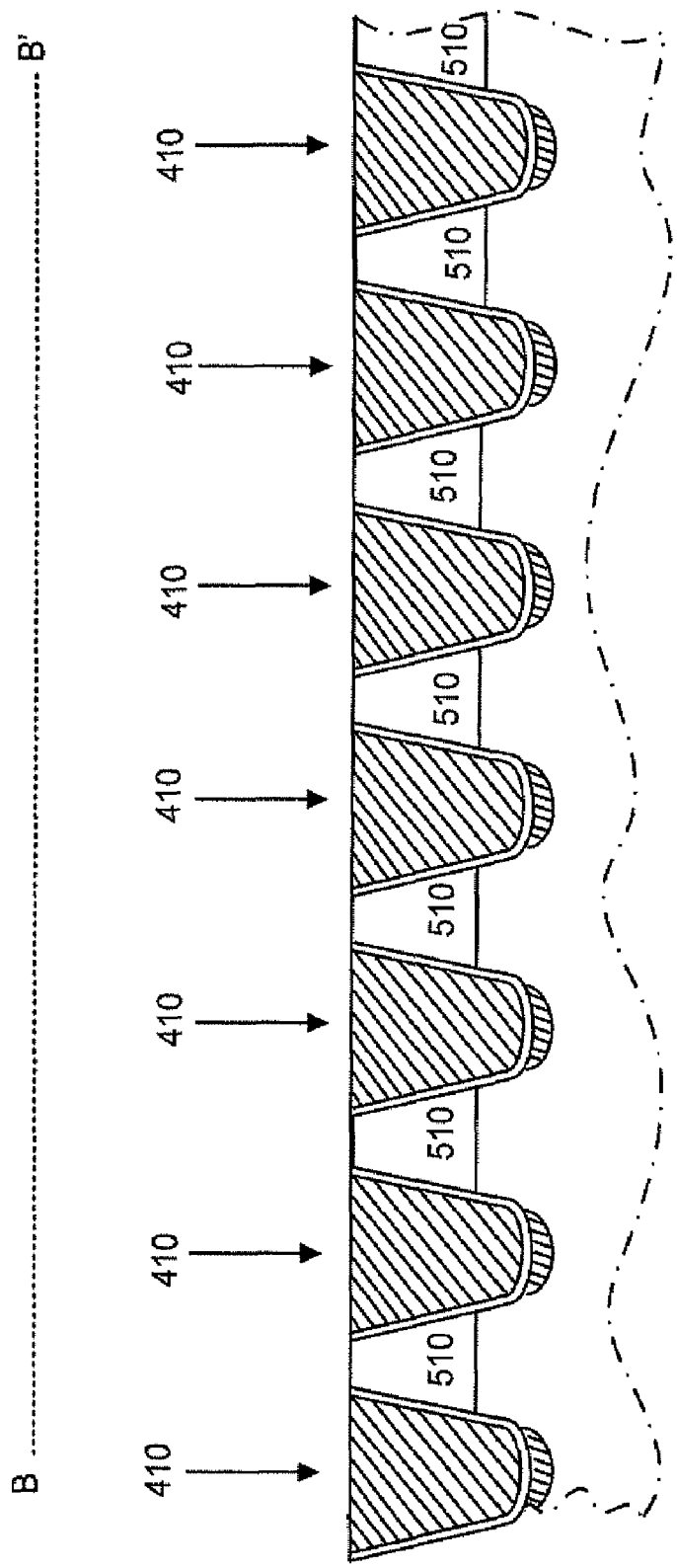

N-type impurities may be implanted in substrate 100, as shown in FIG. 5A, to form Nwells 510, as further shown in FIG. 5B. FIG. 5A depicts a cross-section taken along line A-A' in FIG. 4B, and FIG. 5B depicts a cross-section taken along line B-B' in FIG. 4B. Nwell depth may range from about 500 Å to about 5,000 Å. The impurities may be implanted at a tilt angle of approximately 0 degrees as indicated by the arrows in FIG. 5A.

Figure 6A:
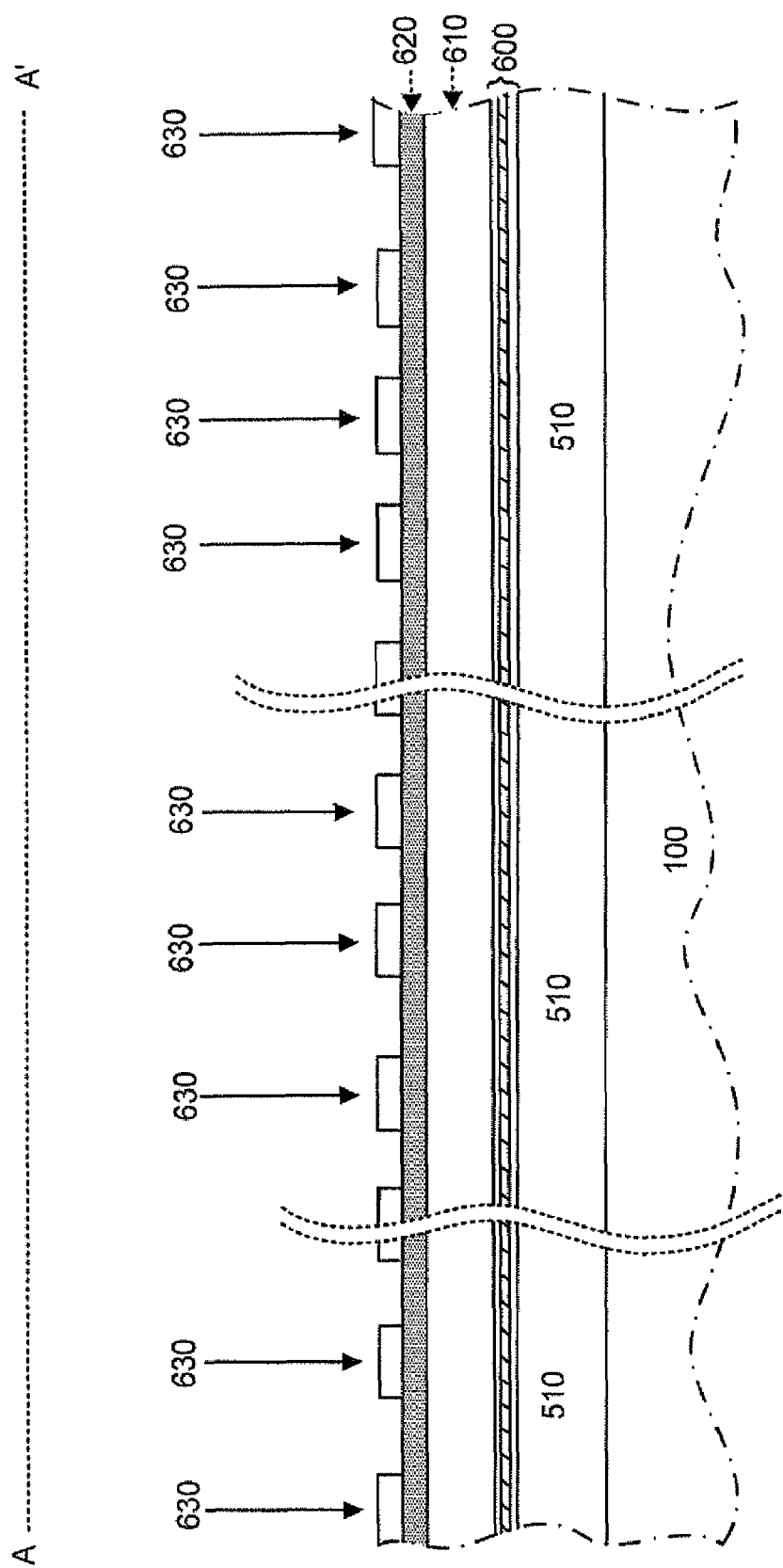
FIGS. 6A and 6B illustrate the formation of a three layer stack over the isolation trenches of FIGS. 5A and 5B consistent with an aspect of the invention.
Figure 6B:
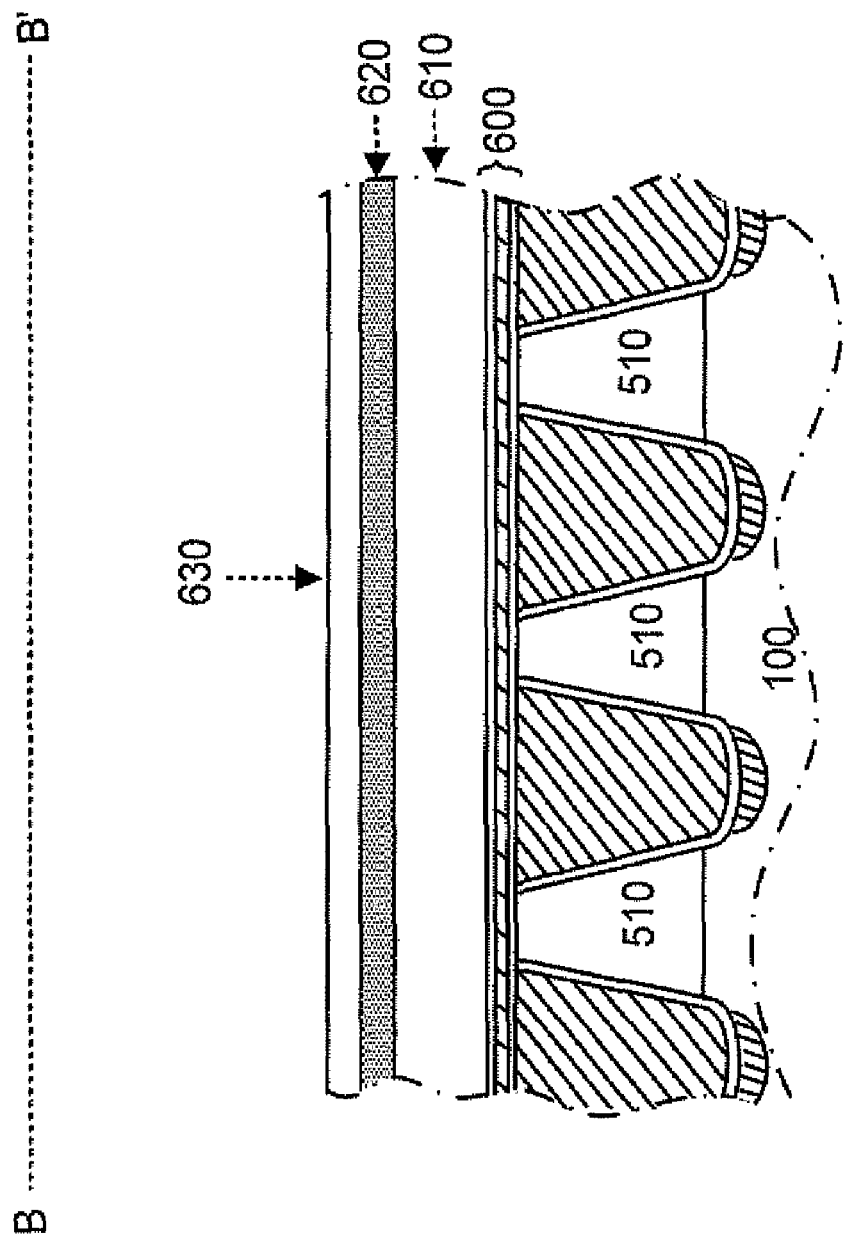

As illustrated in FIGS. 6A and 6B, a three layer stack 600 may be formed over trenches 200 and Nwells 510. FIG. 6A depicts a cross-section taken along line A-A' in FIG. 4A and FIG. 6B depicts a cross-section taken along line B-B' in FIG. 4B. Stack 600 may include a first oxide layer formed over adjacent isolation trenches 200, a charge storage layer formed over the first oxide layer, and a second oxide layer formed over the charge storage layer. The oxide layers may be formed using, for example, existing thermal growth or deposition processes, such as existing chemical vapor deposition (CVD) processes. The first and second oxide layers may include, for example, a silicon oxide material and may each have a thickness ranging from approximately 30 Å to about 100 Å. The charge storage layer may be formed using, for example, existing deposition processes, such as existing CVD processes. In one exemplary embodiment, the charge storage layer may include a nitride material, such as, for example, silicon nitride ($Si_3N_4$). In other embodiments, the charge storage layer may include other known dielectric materials that may be used to store a charge. The thickness of the charge storage layer may range, for example, from about 30 Å to about 200 Å.

A layer 610 may be formed on stack 600 using, for example, existing deposition processes. Layer 610 may include a semiconducting material or a metal. Layer 610 may include, for example, polycrystalline silicon, or a metal such as tantalum nitride (TaN) or titanium nitride (TiN). The thickness of layer 610 may range, for example, from about 200 Å to about 2,000 Å. A contact layer 620 may then be formed on layer 310 using, for example, existing deposition processes. Contact layer 620 may include, for example, cobalt silicide (CoSi), or other materials for forming an electric contact to layer 610.

A layer 630 of photo-resist may be formed on layer 620, and may be patterned using existing photolithographic techniques, to form a hard mask that exposes portions of layer 620 and covers other portions of layer 620. Layer 630 may include, for example, a nitride material. The pattern of layer 630 may correspond to the desired configuration of columns to be formed in layers 610 and 620.

Figure 7A:
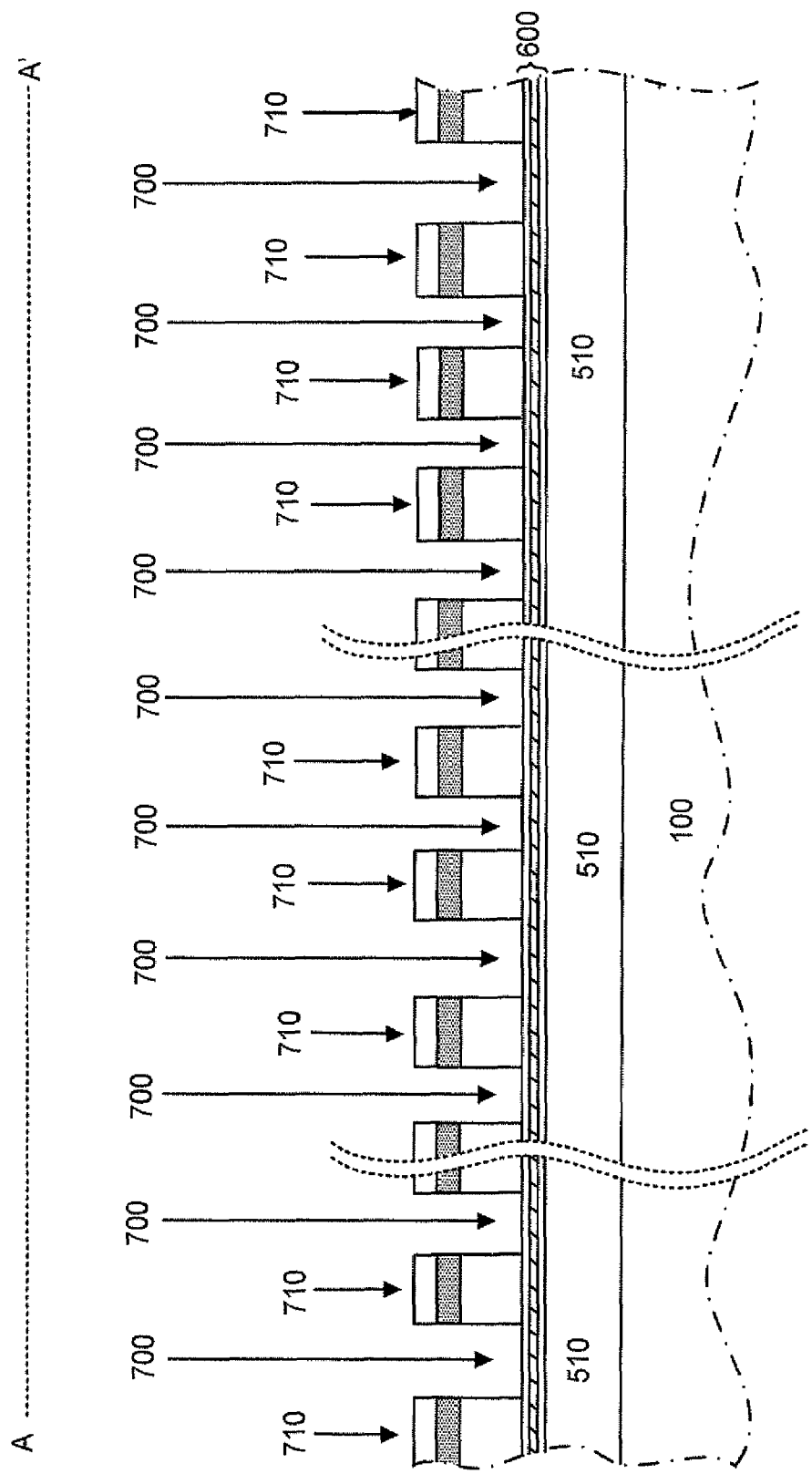
FIGS. 7A and 7B illustrate the formation of columns in layers adjacent the three layer stack of FIGS. 6A and 6B consistent with an aspect of the invention.
Figure 7B:
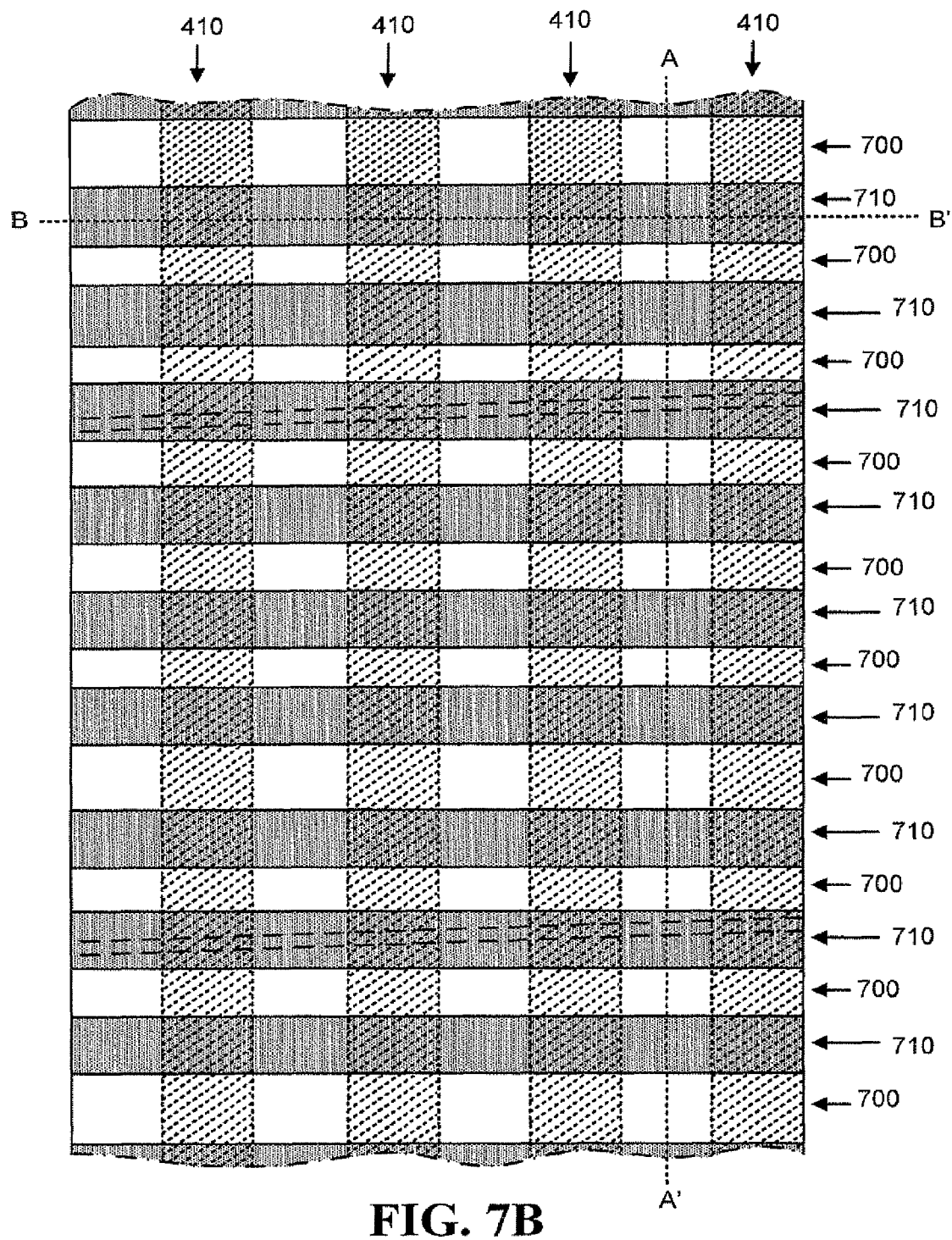

FIGS. 7A and 7B illustrate the formation of trenches 700 in layers 610 and 620 to form columns 710. FIG. 7A depicts a cross-section taken along line A-A' in FIG. 7B. Using the hard mask formed by layer 630, exposed regions of layers 610 and 620 may be etched away, using stack 600 as an etch stop layer. Regions of layers 610 and 620 may be etched away to form trenches 700 and columns 710. As illustrated in FIG. 7B, dielectric material 410 of isolation trenches 200 may reside beneath, and extend approximately perpendicular to, columns 710. Layer 630 may be removed subsequent to the formation of trenches 700 and columns 710. Each column 710 may serve as a memory element in the subsequently formed NAND type device.

Figure 8:
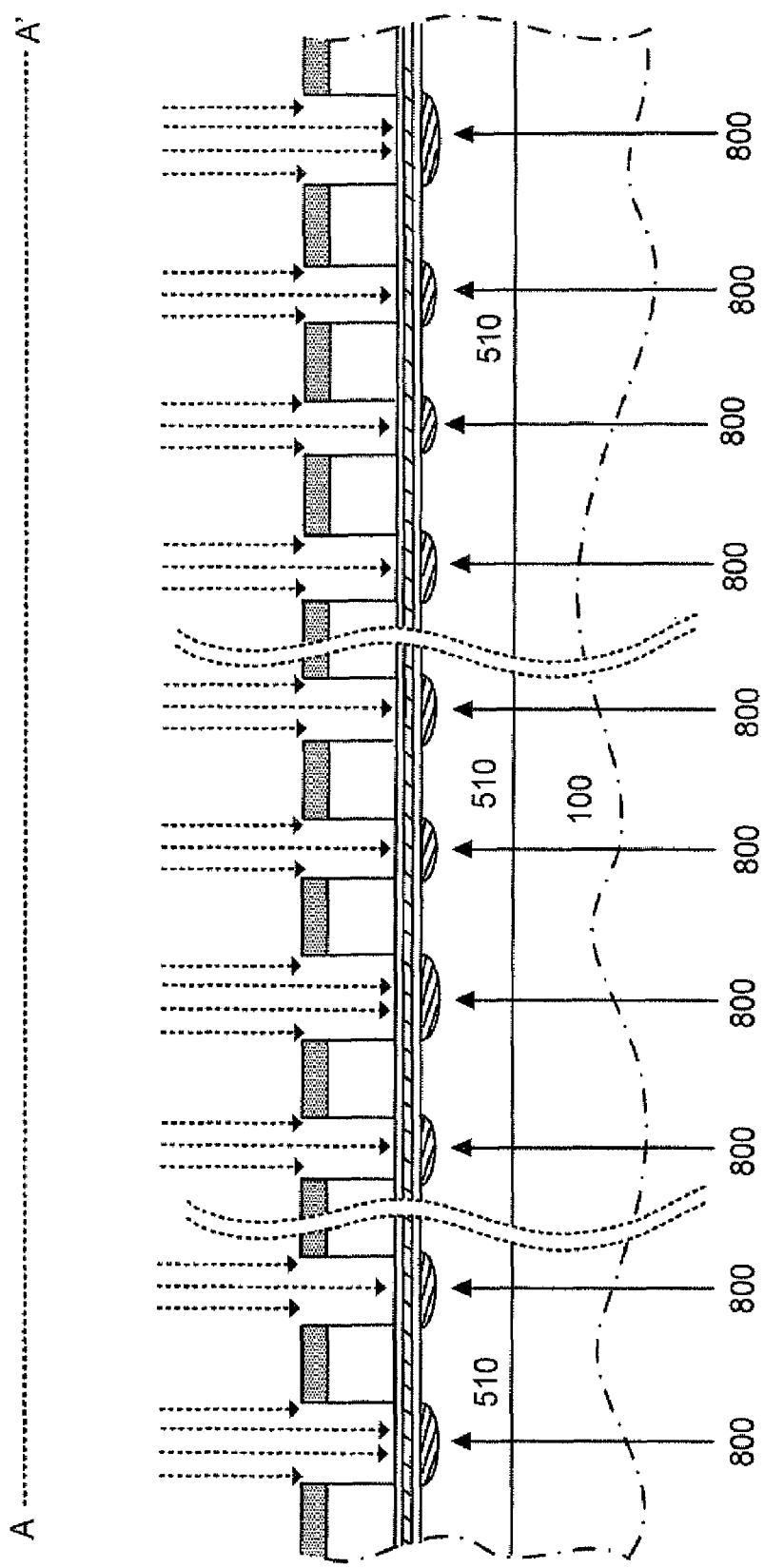
FIG. 8 illustrates the implantation of impurities between the columns of FIG. 8 to form source/drain implantation regions consistent with an aspect of the invention.

Implantation regions 800 may be formed between each column 710, as shown in FIG. 8. Each implantation region 800 may correspond to source and/or drain regions for a corresponding column 710. To form each implantation region 800, impurities may be implanted between columns 710 in each $N_{well}$ 510. The impurities may be implanted at a dosage and implantation energy appropriate for the specific device being formed. The impurities may be implanted at a tilt angle of approximately 0 degrees as indicated by the arrows in FIG. 8. In one implementation, the impurities of regions 800 may include p+ impurities, such as, for example, boron.

Figure 9:
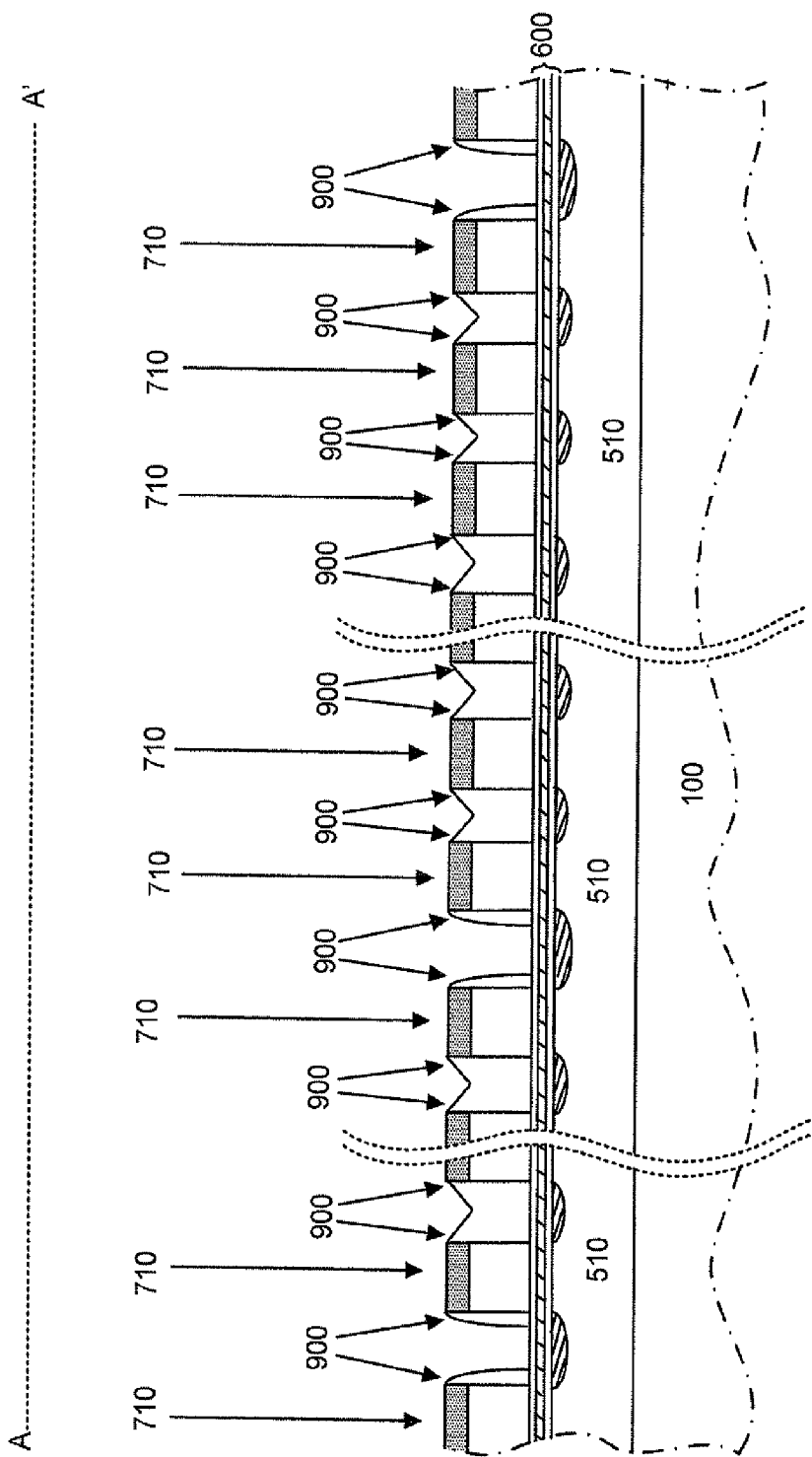
FIG. 9 illustrates the formation of spacers between the columns of FIG. 8 consistent with an aspect of the invention.

As further shown in FIG. 9, spacers 900 may be formed adjacent sidewalls of columns 710. Spacers 900 may be formed of, for example, an oxide material and may be formed using existing deposition processes. Spacers 900 may be formed to a thickness ranging from about 100 Å to about 500 Å. As shown in FIG. 9, some of spacers 900, due to the spacing between columns 710, may "seal" respective trenches 700 between columns 710.

Figure 10:
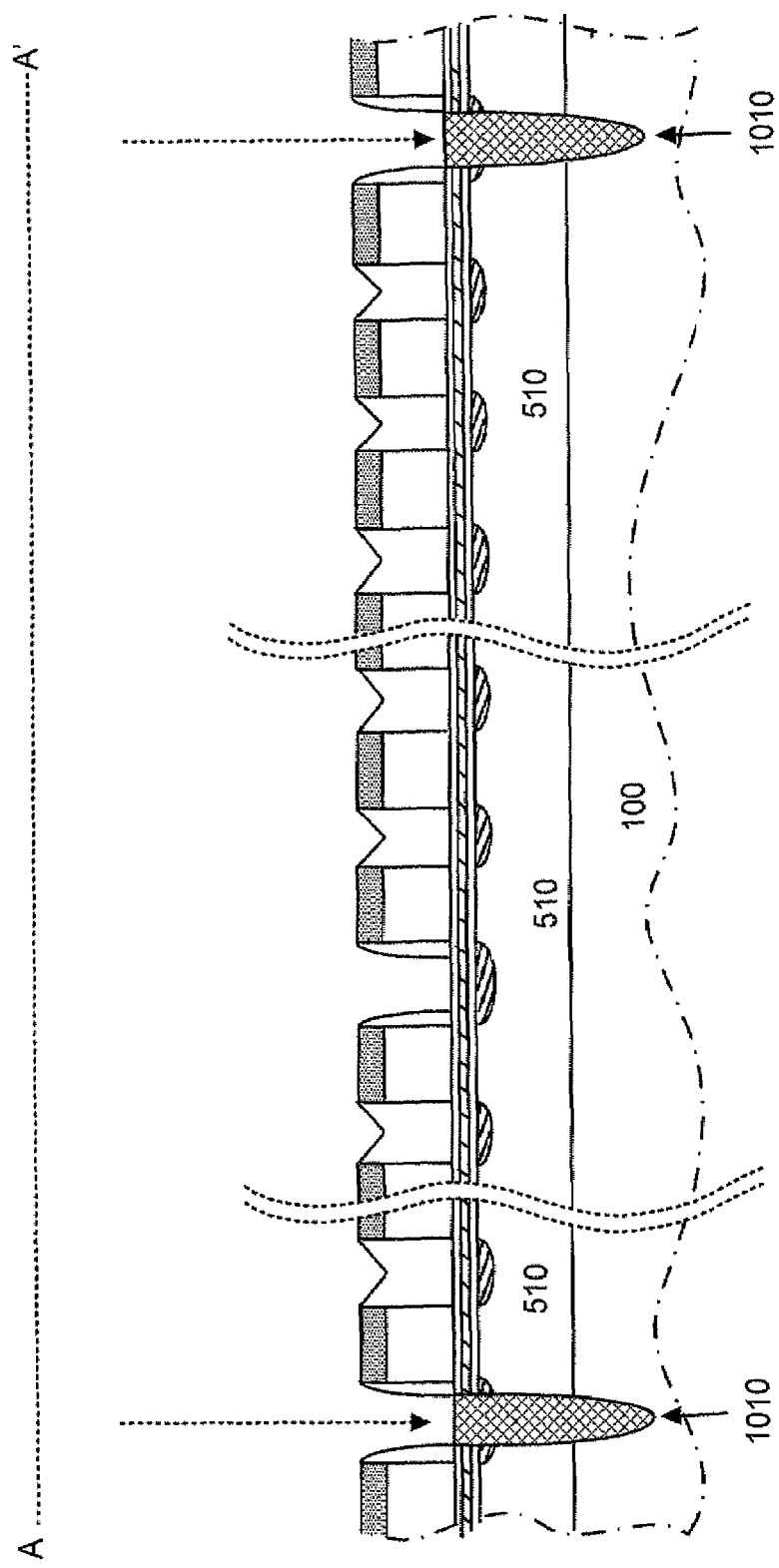
FIG. 10 illustrates the formation of substrate contacts consistent with an aspect of the invention.

Substrate contacts 1010 may then be formed through selected $N_{wells}$ 510 into substrate 100. Impurities, such as, for example p+ impurities, may be implanted into $N_{wells}$ 510, as shown in FIG. 10, to form substrate contacts 1010. For example, the impurities may be implanted between columns 710 into each $N_{well}$ 510. Prior to formation of substrate contacts 1010, portions of three layer stack 600 and dielectric material 410 within respective trenches 700 may be removed (not shown). Substrate contacts 1010 may form a line parallel to columns 710.

Figure 11:
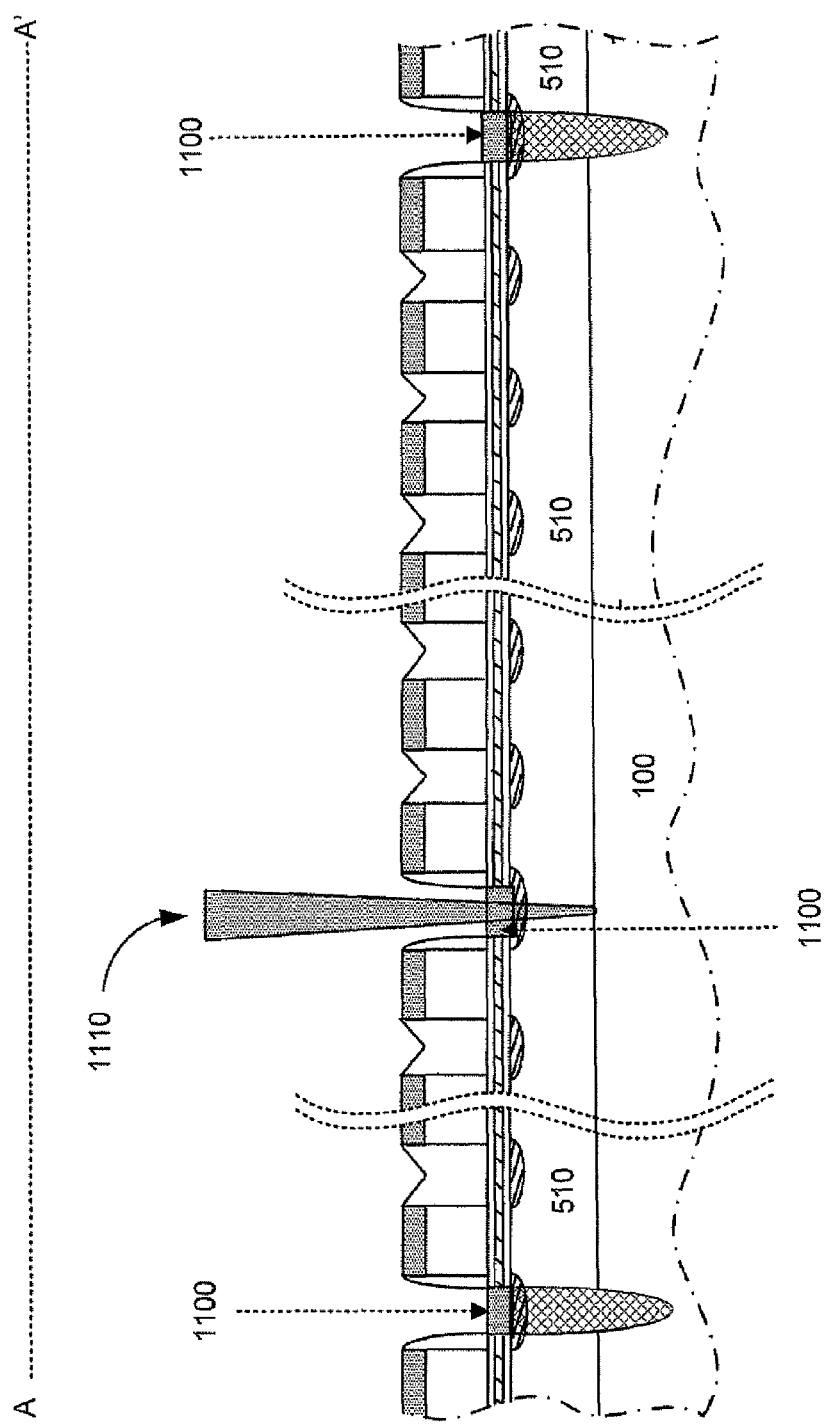
FIG. 11 illustrates the formation of interface regions and drain/$N_{well}$ contacts consistent with an aspect of the invention.

FIG. 11 illustrates the formation of bit-line (BL) drain contacts 1100. Each BL drain contact 1100 may be defined and implanted with N+ impurities. Subsequent to formation of BL drain contacts 1110, contact holes may be filled with contacting material which may include, for example, cobalt (Co), though other materials may be used. An annealing process may be performed to react the cobalt with the underlying semiconducting material (e.g., silicon) in substrate contact 1010 to form an interface region of cobalt silicide, or a mixture of Co and Si, at the bottom of a respective trench 700. Drain/$N_{well}$ contacts 1110 may also be formed as shown in FIG. 11. A contact 1110 may be formed to interconnect with a respective $N_{well}$ 510 beneath stack 600.

Figure 12A:
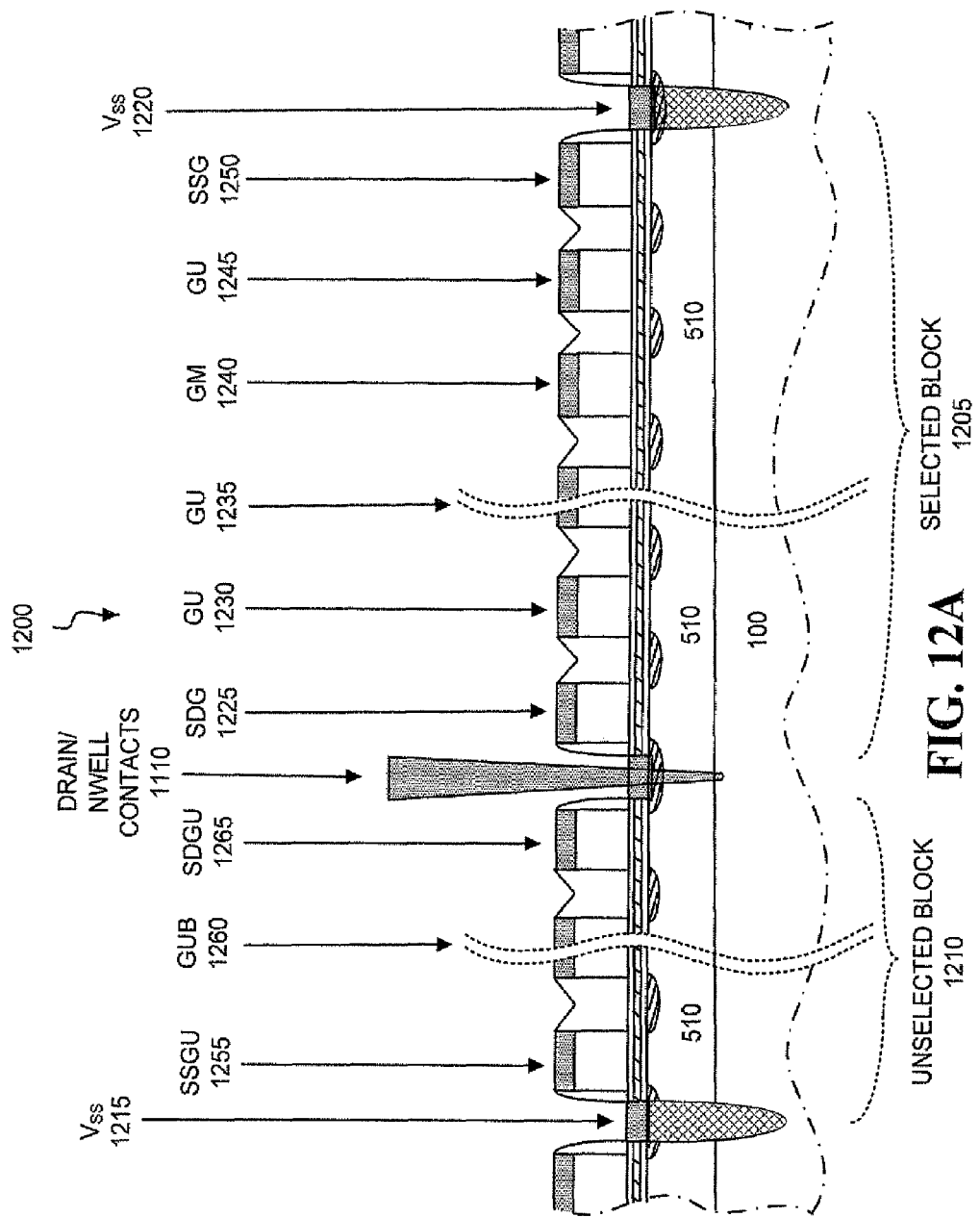
FIGS. 12A and 12B illustrate a P-channel NAND device formed in accordance with aspects of the invention.
Figure 12B:
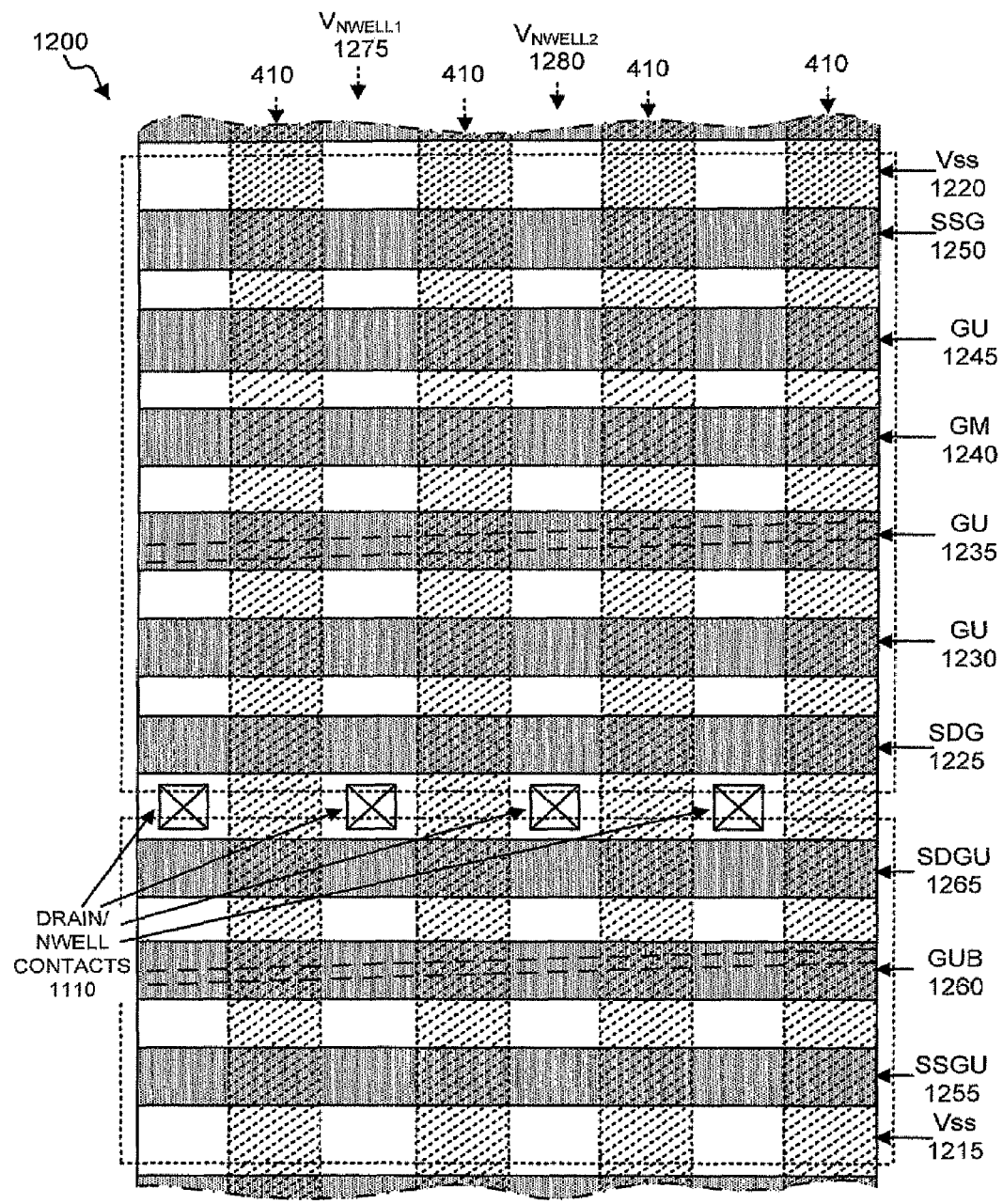

FIGS. 12A and 12B illustrate a P channel NAND device 1200 with isolated $N_{wells}$ consistent with exemplary embodiments. P channel NAND device 1200 may be formed using the exemplary process described with respect to FIGS. 1-11, or may be formed using other existing techniques. As shown in FIG. 12A, device 1200 includes a selected block 1205 and an unselected block 1210 of columns. Unselected block 1210 may be located between $V_{ss}$ 1215 and drain/$N_{well}$ contacts 1110. Selected block 1205 may be located between drain/$N_{well}$ contacts 1110 and $V_{ss}$ 1220. Selected block 1205 may include device columns designated as select drain gate (SDG) 925, unselected gate (GU) 1230, GU 1235, selected gate (GM) 1240, GU 1245 and select source gate (SSG) 1250. Unselected block 1210 may include device columns designated as select source gate-unselect (SSGU) 1255, cell in unselected block (GUB) 1260, and select drain gate-unselect (SDGU) 1265. FIG. 12B further illustrates dielectric material 410 of isolation trenches 200 underlying, and extending approximately perpendicular to, the columns of device 1200. As shown in FIG. 12B, each drain/$N_{well}$ contact 1110 is located between corresponding isolation trenches 200 and extends to an underlying $N_{well}$ 510 located between the isolation trenches 200. Bias voltages $V_{Nwell1}$ 1275 and $V_{Nwell2}$ 1280 may be applied to the Nwells 510, as shown in FIG. 12B, via corresponding drain/$N_{well}$ contacts 1110.

Table 1 depicts the operating voltages for the different modes of NAND device 1200 of FIGS. 12A and 12B. NAND device 1200 may operate in "read," "program," "erase A," and "erase B" modes.

Figure 13:
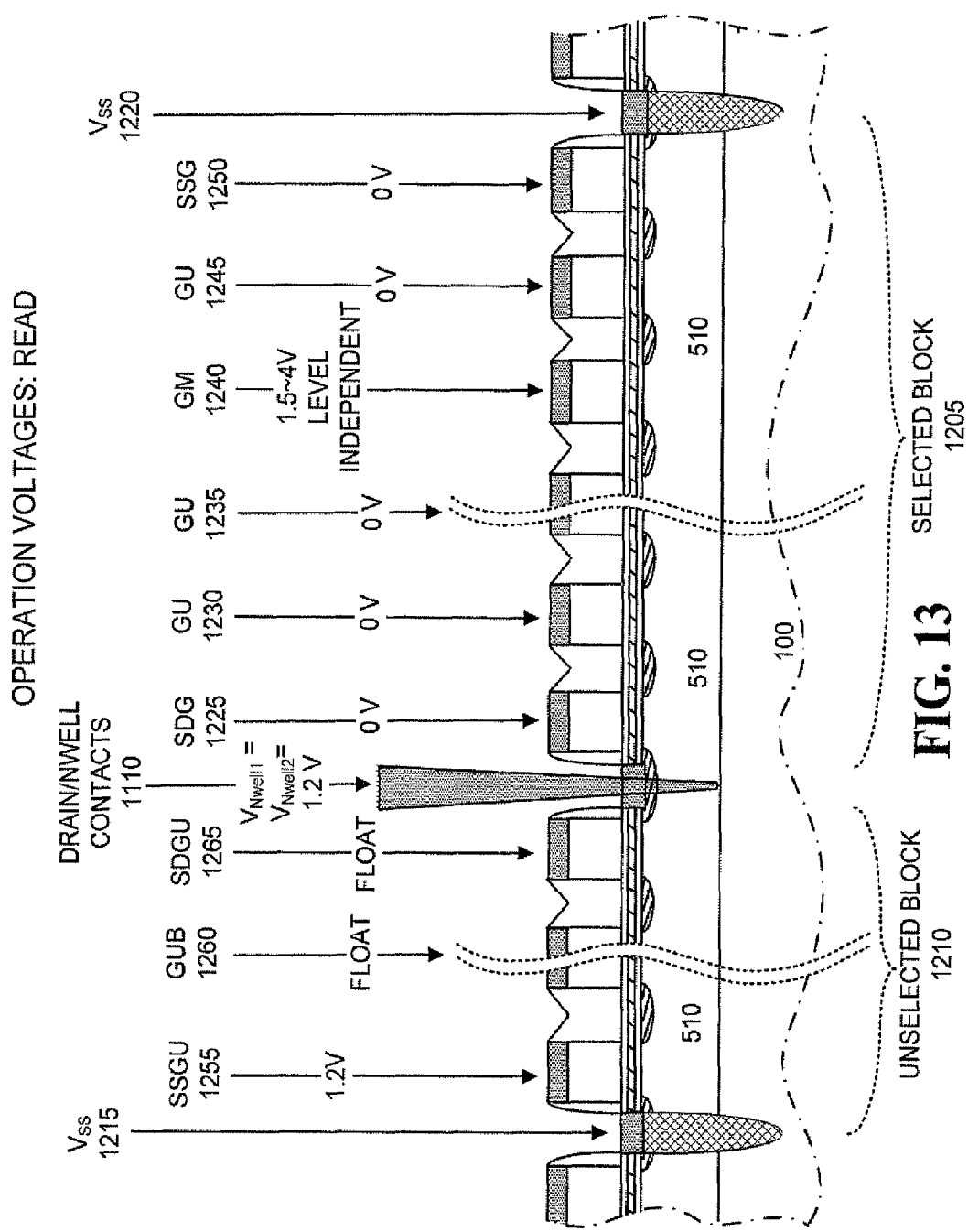
FIGS. 13-16 illustrate operating voltages associated with different operating modes of the NAND device of FIGS. 12A and 12B.

As shown in FIG. 13 and in Table 1, when in the read mode, 0 V may be applied to SDG 1225, GU 1230, GU 1235, GU 1245 and SSG 1250 to "turn on" the channel for selected block 1205. 1.2 V may be applied to SSGU 1255 to "turn off" the channel for unselected block 1210, and to $V_{Nwell1}$ 1275 and $V_{Nwell2}$ 1280. Approximately 1.5 to about 4 V may be applied to GM 1240. The voltage levels applied to GUB 1260 and SDGU 1265 do not affect the operation of device 1200 in read mode, and, therefore, may be permitted to "float." $V_{SS}$ 1215 and $V_{SS}$ 1220 are both connected to ground via substrate 100.

Figure 14:
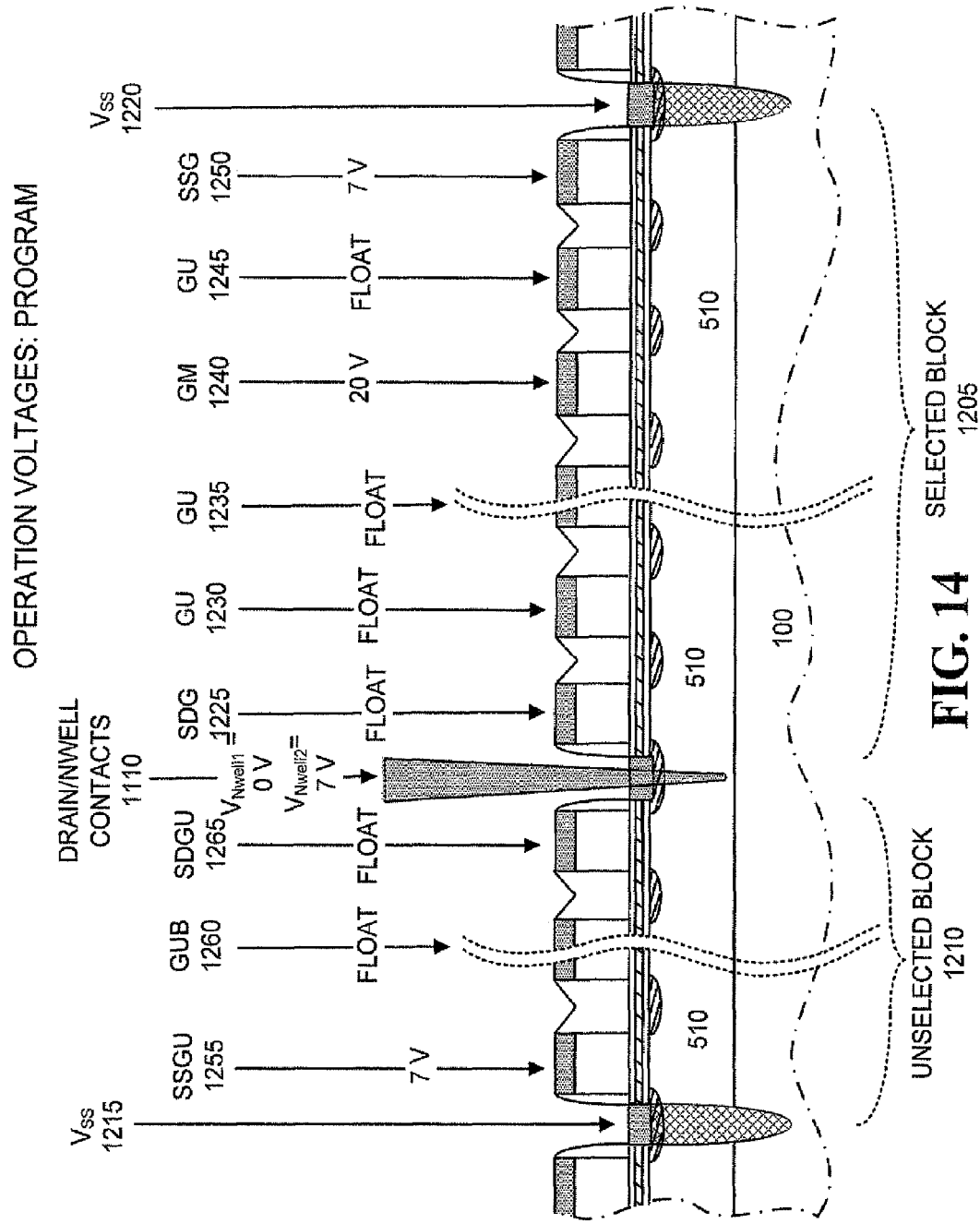

As shown in FIG. 14, when in the program mode, 7 V may be applied to SSGU 1255 and SSG 1250 to "turn off" the channel in the unselected Nwell. 20 V may be applied to GM 1240 for Fowler-Nordheim (FN) programming. 0 V may be applied to $V_{Nwell1}$ 1275 to select the corresponding Nwell and 7 V may be applied to $V_{Nwell2}$ 1280 to unselect the corresponding Nwell. GUB 1260, SDGU 1265, SDG 1225, GU 1230, GU 1235, and GU 1245 may be permitted to "float" in an unselected state. $V_{SS}$ 1215 and $V_{SS}$ 1220 are both connected to ground via substrate 100.

Figure 15:
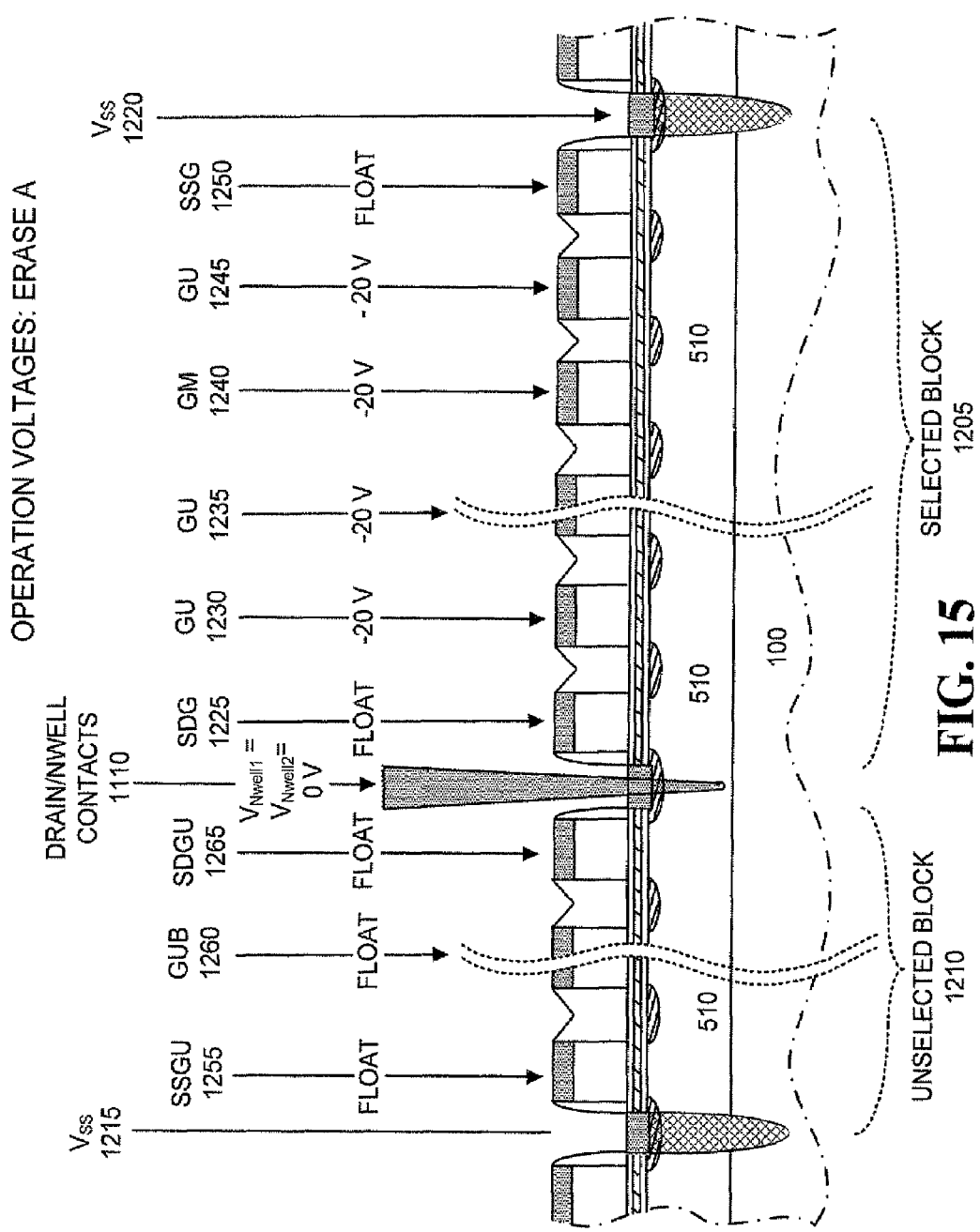

As shown in FIG. 15, when in the erase A mode, −20 V may be applied to GU 1230, GU 1235, GM 1240 and GU 1245. 0 V may be applied to $V_{Nwell1}$ 1275 and $V_{Nwell2}$ 1280. The voltage levels applied to SSGU 1255, GUB 1260, SDGU 1265, SDG 1225 and SSG 1250 may be permitted to "float" to avoid erasing select transistors. $V_{SS}$ 1215 and $V_{SS}$ 1220 are both connected to ground via substrate 100.

Figure 16:
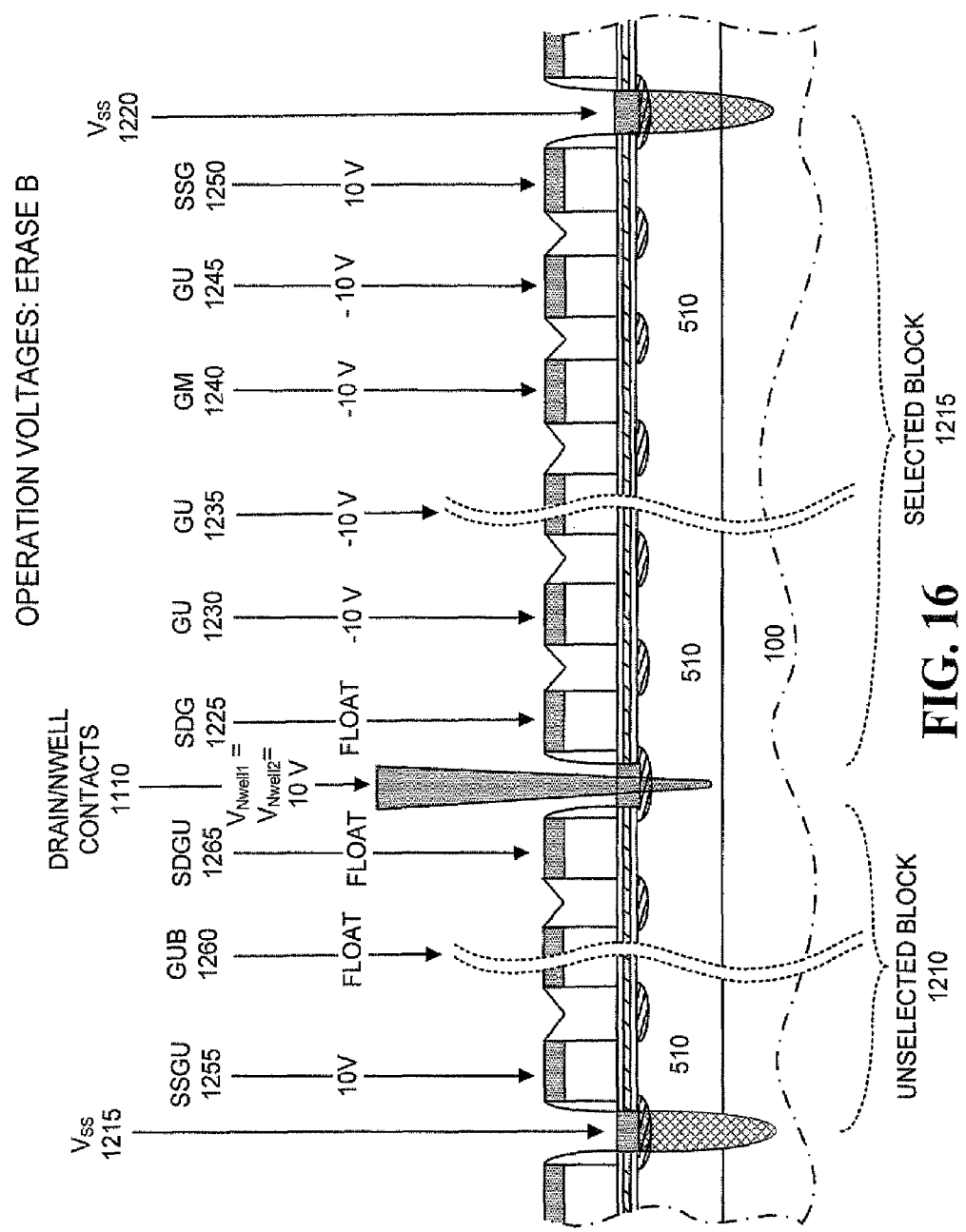

As shown in FIG. 16, when in the erase B mode, −10 V may be applied to GU 1230, GU 1235, GM 1240, and GU 1245. 10 V may be applied to $V_{Nwell1}$ 1275 and $V_{Nwell2}$ 1280 and to SSGU 1255 and SSG 1250 to "turn off" the channels of the selected 1215 and unselected 1210 blocks. The voltage level applied to GUB 1260 may be permitted to "float," and the voltage levels applied to SDGU 1265, and SDG 1225 may be permitted to "float" to avoid erasing drain select transistors. $V_{SS}$ 1215 and $V_{SS}$ 1220 are both connected to ground via substrate 100.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

TABLE 1

Device Operating Voltages

|  | $V_{Nwell1}$ | $V_{Nwell2}$ | $V_{GM}$ | $V_{GU}$ | $V_{SDG}$ | $V_{SSG}$ | $V_{SDGU}$ | $V_{SSGU}$ | $V_{GUB}$ |
|---|---|---|---|---|---|---|---|---|---|
| Read | 1.2 V | 1.2 V | 1.5~4 V Level dependent | 0 | 0 | 0 | Float | 1.2 V | Float |
| Program | 0 | 7 V | 20 V | Float | =$V_{GU}$ | 7 V | =$V_{GU}$ | 7 V | Float |
| Erase A | 0 | 0 | −20 V | −20 V | Float | Float | Float | Float | Float |
| Erase B | 10 V | 10 V | −10 V | −10 V | Float | 10 V | Float | 10 V | Float |

FIGS. 13-16 illustrate the operating voltages for each of the different modes of device 1200. FIG. 13 illustrates the operating voltages for the read mode, FIG. 14, illustrates the operating voltages for the program mode, FIG. 15 illustrates the operating voltages for the Erase A mode, and FIG. 16 illustrates the operating voltages for the Erase B mode.

The foregoing description of embodiments of the present invention provides illustration and description, but is not intended to be exhaustive or to limit the invention to the precise form disclosed. Modifications and variations are possible in light of the above teachings or may be acquired from practice of the invention. For example, while series of acts have been described above, the order of the acts may vary in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein. No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the following claims and their equivalents.

What is claimed is:

1. A device, comprising:
a plurality of columns, each of the columns comprising an oxide-nitride-oxide (ONO) stack and a layer of material formed over the ONO stack and separated from one another by a plurality of first trenches; and
a plurality of wells formed beneath, and transverse to, the plurality of columns, each of the wells comprising a semiconducting material doped with n-type impurities and being separated from one another by second trenches of dielectric material;
a substrate layer formed beneath the plurality of wells;
a first substrate contact formed in a first one of the plurality of first trenches through the ONO stack and through a first one of the plurality of wells into the substrate layer; and
a second substrate contact formed in a second one of the plurality of first trenches through the ONO stack and through a second one of the plurality of wells into the substrate layer.

2. The device of claim 1, where the ONO stack has a thickness ranging from about 90 Å to about 400 Å.

3. The device of claim 1, where the layer of material comprises a semiconducting material or a metal.

4. The device of claim 3, where the semiconducting material comprises polycrystalline silicon and where the metal comprises tantalum nitride or titanium nitride.

5. The device of claim 4, where the layer of material has a thickness ranging from about 200 Å to about 2,000 Å.

6. The device of claim 1, where the first and second substrate contacts comprise regions of semiconducting material doped with p-type impurities.

7. The device of claim 1, further comprising:
a plurality of contacts, each of the plurality of contacts formed to connect with a respective one of the plurality of wells through a respective one of the plurality of first trenches.

8. The device of claim 1, further comprising:
implantation regions formed within the plurality of first trenches, the implantation regions comprising semiconducting material implanted with impurities.

9. The device of claim 8, where the impurities comprise p-type impurities.

10. The device of claim 8, where the implantation regions form source or drain regions for each of the plurality of columns.

11. The device of claim 1, further comprising:
spacers formed within each of the plurality of first trenches adjacent sidewalls of each of the plurality of columns.

12. A device, comprising:
a substrate;
a plurality of wells formed over the substrate and isolated from one another by dielectric trenches, where the plurality of wells comprise a material doped with n-type impurities;
a plurality of memory elements formed over the plurality of wells, each of the memory elements extending approximately perpendicular to the plurality of wells;
a plurality of source/drain regions, each source/drain region formed within one of a plurality of trenches and inside one of the plurality of wells between a pair of the plurality of memory elements, each of the plurality of source/drain regions implanted with p-type impurities;
a first substrate contact formed in a first one of the plurality of trenches through a first one of the plurality of wells into the substrate; and
a second substrate contact formed in a second one of the plurality of trenches through a second one of the plurality of wells into the substrate.

13. The device of claim 12, where the first and second substrate contacts are doped with p-type impurities.

14. The device of claim 12, where each of the plurality of memory elements comprises a layer of semiconducting or metal material formed over an oxide-nitride-oxide (ONO) stack.

15. The device of claim 14, where the ONO stack has a thickness ranging from about 90 Å to about 400 Å.

16. The device of claim 12, where each of the dielectric trenches comprises a liner and a dielectric material formed in each trench.

17. The device of claim 16, where each trench of the dielectric trenches is formed to a depth of approximately 3,600 Å.

18. The device of claim 12, further comprising:
spacers formed within each of the plurality of first trenches adjacent sidewalls of the memory elements.

19. A device, comprising:
a plurality of columns, each of the columns comprising an oxide-nitride-oxide (ONO) stack and a layer of material formed over the ONO stack and separated from one another by a plurality of first trenches;
a plurality of wells formed beneath, and transverse to, the plurality of columns, each of the wells comprising a semiconducting material doped with n-type impurities and being separated from one another by second trenches of dielectric material; and
a plurality of contacts, each of the plurality of contacts formed to connect with a respective one of the plurality of wells through a respective one of the plurality of first trenches.

* * * * *